United States Patent [19]

Gerard et al.

[11] Patent Number: 5,075,742
[45] Date of Patent: Dec. 24, 1991

[54] SEMICONDUCTOR STRUCTURE FOR OPTOELECTRONIC COMPONENTS WITH INCLUSIONS

[75] Inventors: Jean-Michel Gerard; Claude Weisbuch, both of Paris, France

[73] Assignee: French State represented by the Minister of the Post, Telecommunications and Space, Issy-Les-Moulineaux, France

[21] Appl. No.: 639,530

[22] Filed: Jan. 10, 1991

[30] Foreign Application Priority Data

Jan. 10, 1990 [FR] France ................................. 90 00229

[51] Int. Cl.$^5$ ............................................. H01L 33/00
[52] U.S. Cl. ........................................ 357/17; 372/48; 372/43; 372/45; 357/16
[58] Field of Search ....................... 357/16, 17; 372/43, 372/44, 45, 46, 47, 48, 49, 50

[56] References Cited

U.S. PATENT DOCUMENTS 4,751,194  6/1988  Cibert et al. ....................... 357/16 X
4,786,951  11/1988  Tokuda et al. ..................... 357/16 X
4,802,181  1/1989  Iwata ................................. 357/16 X

FOREIGN PATENT DOCUMENTS 63-156363  6/1988  Japan ..................................... 357/16

OTHER PUBLICATIONS

Marinace et al., "Ge Inlays in a GaAs Matrix by Solvent Evaporation," IBM Technical Disclosure Bulletin, vol. 6, No. 2, Jul. 1963, p. 81.

*Primary Examiner*—William Mintel
*Attorney, Agent, or Firm*—Fleit, Jacobson, Cohn, Price, Holman & Stern

[57] ABSTRACT

The object of the invention is to reduce the influence of dislocations on the functioning of structures for optoelectronic component, such as laser, made from semiconductor materials. Accordingly, one of the lasers of such a structure comprises three-dimensional inclusions in a semiconductor material with a thinner forbidden band than the forbidden band of the layer material. The inclusions are e.g. distributed over several planes of the active layer of a laser, and may be in InAs introduced into a layer in GaAs.

5 Claims, 3 Drawing Sheets

SEMICONDUCTOR STRUCTURE FOR OPTOELECTRONIC COMPONENTS WITH INCLUSIONS

BACKGROUND OF THE INVENTION

1. Field of the Invention

The present invention relates to a multilayer structure in semiconductor material, especially for a solid state laser. More generally, the invention has applications in optoelectronics, and monolithic integration in opto- and microelectronics.

2. State of the Prior Art

Silicon Si and gallium arsenide GaAs are currently the most widely used semiconductor materials. Although a very high scale of integration has been obtained in microelectronics using silicon, optoelectronics has developed from heterostructure lasers with semiconductor materials from groups III and V of the Mendeleevian classification, such as GaAs/GaAlAs on GaAs substrate and such as GaInAs/AlInAs or GaInAs/InP on InP substrate. The integration on a common substrate of optoelectronic and microelectronic devices with complementary functions produced from different materials, e.g. material from groups III and V and silicon, is a particularly appealing perspective which has given rise to intensive research work in recent years.

A silicon substrate has numerous advantages: solidity, perfection, high thermal conductivity, low cost, etc. It is mainly the deposition of III-V compounds on silicon that has mainly been studied. Much progress has been achieved concerning this type of epitaxial growth and has enabled the obstacles encountered to be partially overcome: the difficulty in depositing a polar material such as III-V semiconductors on a non-polar material such as silicon, and the major lattice parameter difference between these, e.g. 4% for GaAs on silicon.

In particular, this mismatch implies the presence of a very high quantity of dislocations in the first tens of nanometers of the epitaxially deposited material. These dislocations can be due to the preparation of the state of the surface upon which the epitaxial growth is carried out, and/or to a degradation over time of the crystallographic quality of the epitaxial semiconductor. Whatever their origin, these dislocations beget local inhomgeneities and can develop.

For instance, when the crystalline lattice parameter of a layer is lower than that of a second layer, the first layer is subjected to tension and dislocations occur in the layer interface. If the first layer is the active layer of a laser component, the performances of the laser component are highly dependent on the number of dislocations present. These defects do, of course, affect the threshold current of this component with minority carriers, but also affect its ageing. When the component is operating, the presence of an electric field, and of high photon and carrier densities also help the displacement of existing defects and assist the generation of new defects.

For conventional optoelectronics applications, optoelectronic components are produced from III-V semiconductor heterostructures, such as GaAs/GaAlAs on GaAs substrate and such as GaInAs/AlInAs or GaInAs/InP on InP substrate. The dislocation rates obtained during the growth of these structures by conventional techniques, like molecular beam epitaxy and vapor phase epitaxy from organometallic compounds, are in the region of $10^4/cm^2$. The rates are compatible with proper functioning of these optoelectronic components, as witnessed by the large-scale commercial use of some of these, such as GaAs/GaAlAs laser diodes with 0.85-$\mu$m wavelength; however, in certain cases, the displacement and multiplication of the dislocations during operating of the components have been observed and correlated with lifetime problems of these components. The dislocation-related problems, latent in this instance, become crucial if these defects are more numerous in the material used.

In the case of the growth of a III-V material on silicon, it is therefore primordial to seek as low a dislocation rate as possible in the structure. The dislocation rates in the superficial layer of the material remain in the region of $10^6$ to $10^7$ dislocations per $cm^2$. The number of dislocations tends to decrease with the thickness of the deposit, but depositions cannot exceed 4 to 5 microns of material. Beyond that, the very major difference in coefficients of expansion between the silicon and the III-V material entails the formation of numerous cracks in the epitaxial layer when the growth temperature, in the region of 500° to 600° C., drops to room temperature. This failure of the attempts to reduce the number of dislocations is charged with consequences as regards the stability of laser components fabricated on silicon substrates.

To illustrate the results obtained, consideration is directed to the case of a GaAs structure on Si, which is the case that has been studied most intensely. No instance of room-temperature continuous-emission operation has been observed to date for double heterostructure lasers, as the component degrades below the laser threshold. On the other hand, a room-temperature operation in the pulsed mode, then in the continuous mode for short periods in the region of one minute has been observed for quantum well lasers, i.e., structures with confinement separated by index gradient. The reduction of the dimensions of the active layer is therefore clearly beneficial for the operating of the optoelectronic component. This result is related to several favourable factors. The use of the separate confinement concept brings about a reduction of the threshold current of the component, and therefore an increased stability of the latter. Moreover, there is a reduction in the size of the active layer which is the only region of the structure in which the two types of carriers are simultaneously present: the diffusion of the carriers before recombination then occurs in a plane and the dislocations no longer occur in the carrier capture except by their line fragment intersecting the active layer. However, even with these quantum well structures, the components obtained are not very stable, and have lifetime-related problems.

OBJECT OF THE INVENTION

The main object of this invention is to reduce the influence of dislocations on the operating of structures for optoelectronic components, such as lasers, fabricated from semiconductor materials.

SUMMARY OF THE INVENTION

Accordingly, there is provided a structure having plural layers in semiconductor material wherein one of the layers comprises three-dimensional inclusions in a semiconductor material having a narrower forbidden band (bandgap) than the forbidden band of the material of said layer.

Preferably, the layer comprising the inclusions constitutes the active layer of an optoelectronic component, such as a laser. The inclusions ensure a function of traps for the carriers, thereby avoiding diffusion of the latter towards the core of the dislocations and the associated nonradiative centers. The inclusions are the site of the radiative recombination between electrons and trapped holes leading to the laser gain.

The inclusions are inserted during growth, by using the three-dimensional nucleation mode observed during the epitaxy of III-V materials that are highly mismatched with regard to the substrate used. Accordingly, a method for fabricating a multilayer structure embodying the invention comprises the two following successive steps during the growth of the material constituting one of said layers:

interrupting at least once said growth, and depositing a thin layer of the semiconductor material having a narrower forbidden band than the forbidden band of the material of said layer thereby constituting three-dimensional inclusions.

BRIEF DESCRIPTION OF THE DRAWINGS

Further features and advantages of the invention will be apparent from the following particular description of several preferred embodiments of this invention as illustrated in the corresponding accompanying drawings in which.

DESCRIPTION OF THE PREFERRED EMBODIMENTS

As appears by comparison of FIGS. 1 to 4, a structure of a semiconductor laser according to the invention is similar to a known solid-state laser structure. The known structure comprises a semiconductor substrate 1 and a stacking of three or four layers in semiconductor material 2, 3, 4 and 5 placed on a major side of the substrate 1.

Figure 1:
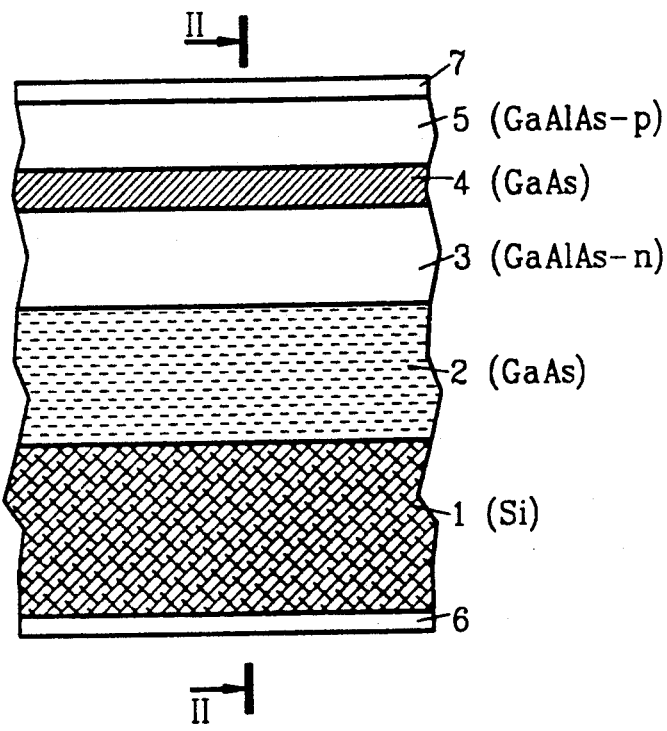
FIG. 1 is a schematic transverse cross-sectional view of a laser structure according to the prior art.
Figure 2:
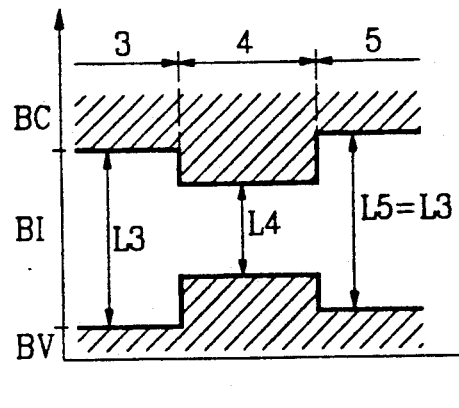
FIG. 2 is a thickness - quantum energy diagram of the structure according to FIG. 1, in correspondence with the line II—II in FIG. 1.
Figure 3:
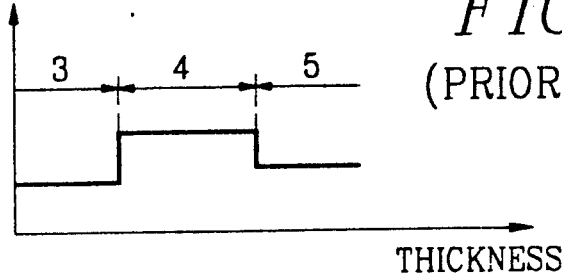
FIG. 3 is a thickness - refractive index diagram of the structure shown in FIG. 1, according to the line II—II.

In the structure illustrated in FIG. 1, four layers 2 to 5 are provided and constitute a double heterostructure. The layers 2 to 4 are in semiconductor material offering narrow forbidden bands (bandgap) BI between valence band BV and conduction band BC, and high refractive indexes; the semiconductor material of the layers 2 and 4 can be GaAs. The two other layers 3 and 5 are in semiconductor material with forbidden band widths L3 and L5 that are larger than the width of the forbidden band L4 of the layer 4, as shown in FIGS. 2 and 3, and low refractive indexes. The narrowness of the forbidden bands of the layers 2 and 4 is defined here in relation to largeness of the forbidden bands of the layers 3 and 5. Under these conditions, the layers 3 and 5 confine, as is known, a laser beam propagating itself in the active layer 4 intermediate between the layers 3 and 5.

According to a preferred embodiment, the stacking of layers 2 to 5 constitutes a double heterostructure GaAs/GaAlAs formed on a substrate in silicon Si.

The layer 2 is of the monolayer or multilayer type and is epitaxially deposited directly on said major side of the substrate 1 and is in GaAs. The layer 2 constitutes a buffer layer as un-dislocated as possible whose sole purpose constituted by the layers 3, 4 and 5. According to certain embodiments, the layer 2 can be omitted.

The active layer 4 is also in GaAs, and is interposed between the thick layers 3 and 5 and is thinner than layers 3 and 5.

The layers 3 and 5 are in ternary alloy GaAlAs with a lower refractive index than that of the active layer 4 interposed between the layers 3 and 5. The layers 3 and 5 are doped with opposite conductivity impurities, respectively of type n and p. The injected electrons and holes are thus confined and recombine in the active layer 4 which ensures the confinement of the optical wave. In the layer 4 which constitutes the active region of the laser, energy is transferred to the electromagnetic wave by the recombination of the carriers.

To be complete, it should be noted that the invention may apply to any type of known structure in semiconductor materials for laser or optoelectronic components such as optical modulators or optical switches. In particular, the confining layers 3 and 5 may each be constituted by several layers of the same material but with different doping concentrations, and the upper layer 5 may be covered with other layers in semiconductor material that is different and/or of different conductivity, or even with an insulating layer such as $SiO_2$ or $Si_3N_4$. Two thin metallic layers 6 and 7 forming electrodes are, of course, provided on both sides of the stack of layers.

Figure 4:
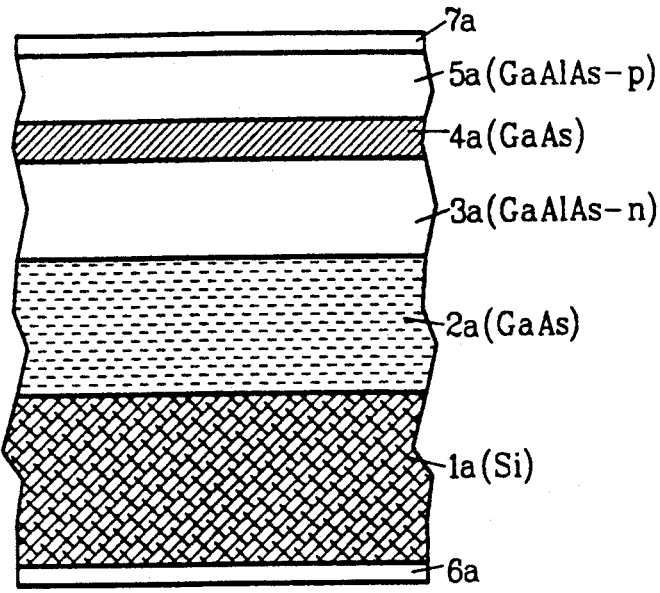
FIG. 4 is a schematic transverse cross-sectional view of a multilayer structure in semiconductor material embodying the invention, of a similar type to that of FIG. 1.

Turning to FIG. 4, the semiconductor laser structure embodying the invention comprises a substrate 1a, and superposed layers 2a, 3a, 4a and 5a as well as electrodes 6a and 7a which are arranged in relation to one another in the same way as the substrate 1, the layers 2 to 5 and the electrodes 6 and 7 in the known structure shown in FIG. 1. All the layers, with the exception of the layer 4a, are identical to the corresponding layers in the known structure.

Figure 5:
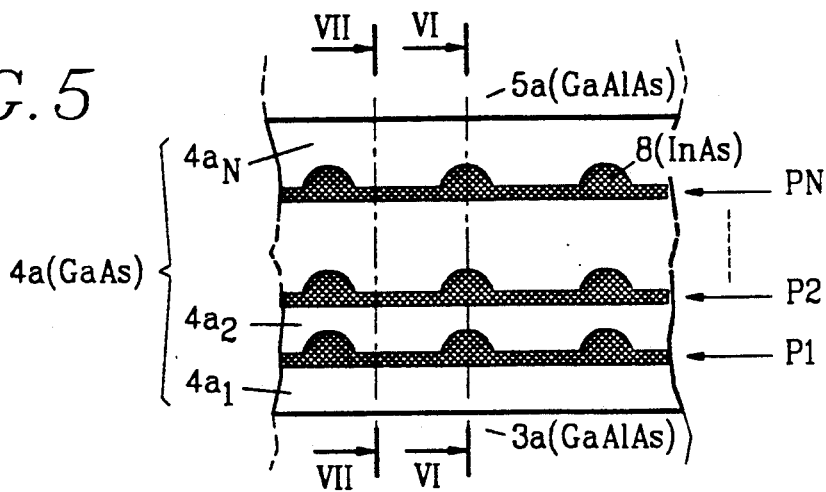
FIG. 5 is a schematic detailed view of the active layer in the structure shown in FIG. 4.
Figure 6:
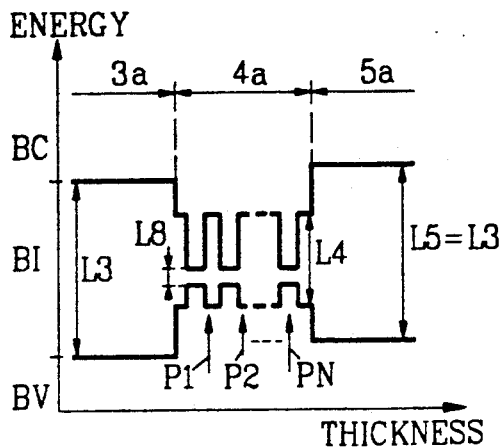
FIGS. 6 and 7 are thickness - quantum energy diagrams of the structure shown in FIG. 4, in correspondence with lines VI—VI and VII—VII in FIG. 5, respectively.

According to the invention, the active layer 4a is modified by comparison with the previous layer 4, by punctual inclusions 8 in a semiconductor material, such as indium arsenide InAs having, as shown in FIG. 6, a smaller width of forbidden band L8 than that L4 of the semiconductor material of the active layer 4a, such as gallium arsenide GaAs. As shown in detail and schematically in FIG. 5, the inclusions 8 of InAs form islands substantially of a semi-spherical cap shape which are spread over the layer 4a, with a substantially uniform density, in several planes parallel to the confinement layers 3a and 5a. To avoid overloading of FIG. 5, only three planes P1, P2, PN of inclusions 8 have been illustrated in it.

The fabrication of the semiconductor laser embodying the invention is analogous to that of a laser of the same type according to the prior art, with the exception of the formation step of the active layer 4a. The entire laser structure is produced by the same growth technique, e.g. molecular beam epitaxy MBE, or by vapor phase epitaxy in another embodiment.

Figure 8:
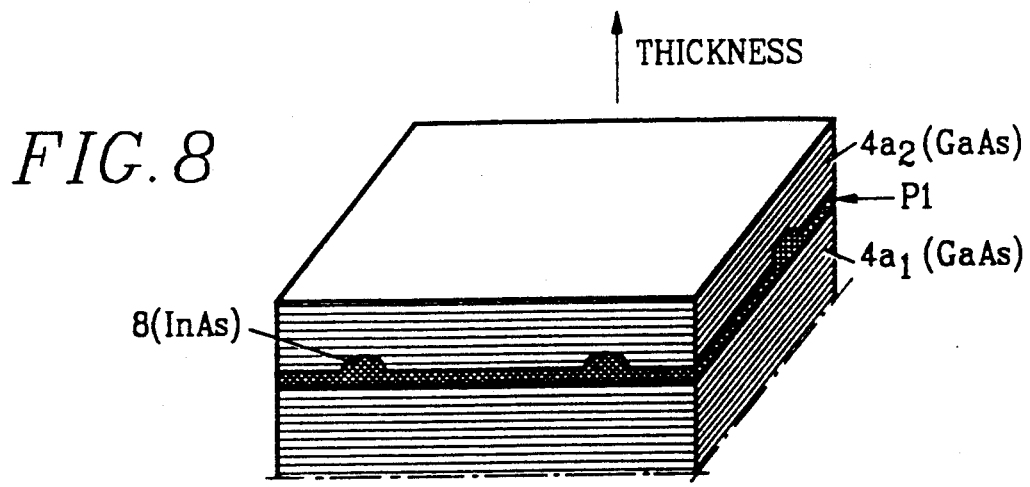
FIGS. 8, 9 and 10 are schematic views in perspective of the structure in FIG. 4 for illustrating the state of the active layer in FIG. 5 before and after deposition of inclusions in a plane and after deposition of a sublayer of active layer on the inclusions, respectively.
Figure 9:
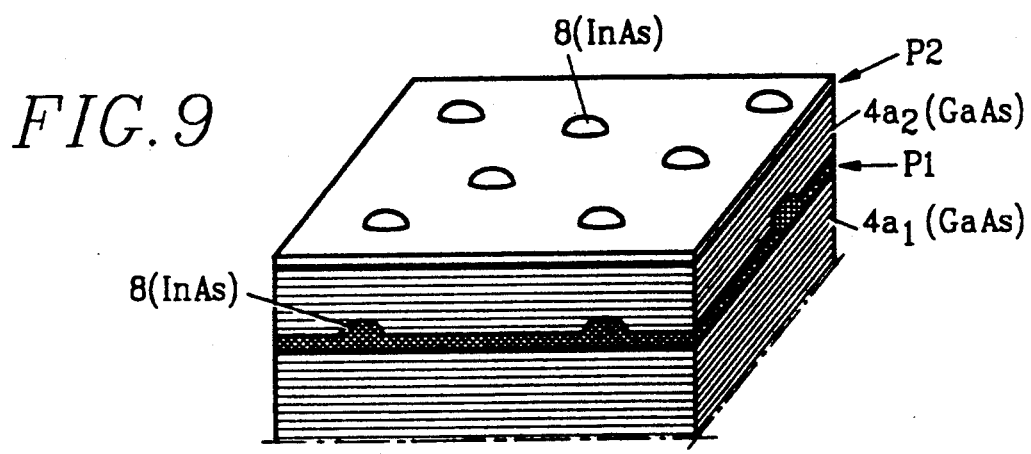
Figure 10:
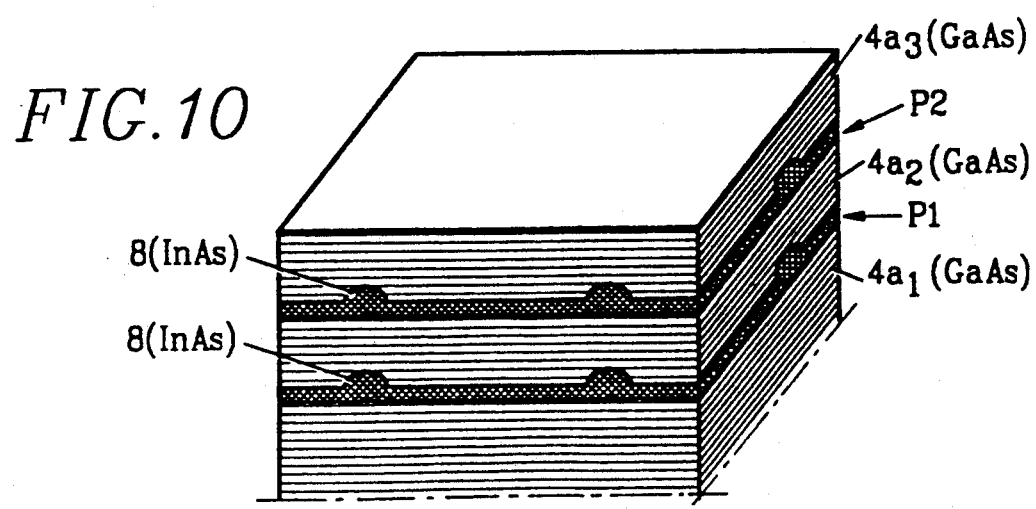

The growth by molecular beam epitaxy of the material GaAs constituting the layer 4a begins at the end of the formation of the confinement layer 3a. When the thickness of this layer 4a reaches each of the planes P1 to PN, the growth is interrupted at this point of the structure, as shown in FIG. 8 for the plane P2. A thin layer of InAs is deposited on the surface of the "sub-layer" thus formed $4a_1$, $4a_2$, ... of the active layer 4a. The material, InAs, has a lattice that is highly mismatched with GaAs, in the region of 7%, which strongly influences the InAs growth mode. The first molecular layer P1 of InAs, in practice having a thickness of approximately 0.3 nm, elastically accommodates this lattice parameter difference. However, from the second monolayer on, corresponding to the plane P2, a transition to a three-dimensional growth mode is observed at the usual growth temperature of 500° to 550° C. Islands 8 of indium arsenide InAs form at the surface. During an observation of these islands with a Scanning Transmission Electron Microscope (STEM), the size of the InAs islands is seen to be fairly homogeneous, and the distribution of the islands is relatively uniform on the surface of the sample, as shown at the level of the second active sub-layer $4a_2$ in FIG. 9. In practice, each inclusion is inscribed in a small paving with a size of $5 \times 5 \times 2$ nm$^3$ approximately, and the inclusions are spread over one or plural planes, such as the planes P1, P2 and PN illustrated in FIG. 5. After each deposition of inclusions in a plane, the epitaxial growth of GaAs is again performed so as to form another active sub-layer. The inclusions 8 are thus buried inside the active layer 4a. Constrained within the GaAs lattice, the inclusions do not however contain any dislocation.

Figure 7:
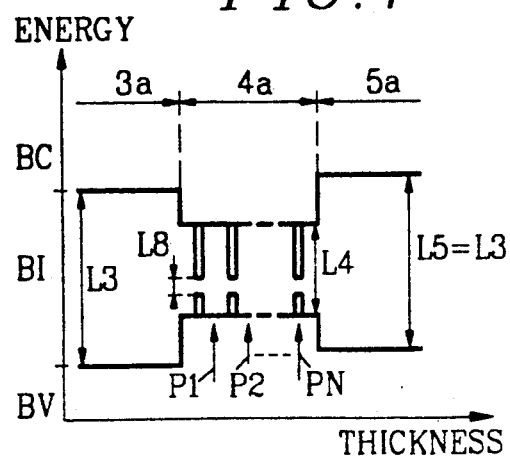

As shown in FIGS. 6 and 7, the indium arsenide InAs has a smaller forbidden band energy (bandgap energy) than that of gallium arsenide GaAs. The inclusions 8 are therefore more attractive for the electrons and the holes. A photoluminescence study of InAs structures in GaAs shows that the trapping of carriers by the inclusions is very efficient, which is translated by a very intense luminescence due to the inclusions, and a very small contribution of the GaAs lattice, and that the optical quality of these structures is very good. A transmission study of these structures shows that this luminescence is intrinsic, i.e., linked to the presence of a high density of states in conjunction with the luminescence energy. Finally, the size of the inclusions and consequently the position of the associated luminescence line depend on the quantity of InAs deposited after the transition to a three-dimensional growth mode.

Furthermore, the density of the InAs inclusions 8 in a plane P1 to PN is very high, approximately $10^{12}$/cm$^2$, and is particularly high compared with the number of dislocations in known GaAs structures on Si, typically in the region of $10^6$/cm$^2$. The inclusions 8 situated near a dislocation therefore only represent a tiny fraction of their population. The injected carriers therefore have a very high probability of being trapped by an inclusion rather than by a dislocation, and by an intact inclusion rather than by an inclusion perturbed by the proximity of a dislocation. Finally, the presence of highly constrained areas in the structure around the InAs inclusions can inhibit the propagation of existing dislocations.

The confinement factor $\Gamma$ which is defined as the fraction of the optical wave lying in the active layer 4a, is low for the structure embodying the invention, though it is close to 1 in the double heterostructure as shown in FIG. 1. For a plane of inclusions P1 to PN, the confinement factor is close to that of a structure with an 0.6-nm wide quantum mono-well. On the other hand, the gain per unit of volume of the active medium $g_v$ increases very significantly for such a laser with quantum boxes. To obtain the same amplification of the optical wave in the cavity, the modal gain $\Gamma \cdot g_v$ must be the same for the two structures. It is then necessary to multiply the inclusion planes in the structure in order to increase the factor of optical confinement. This requirement is met e.g. by forming N=10 to 40 planes P1 to PN of InAs inclusions 8 in a GaAs cavity having a thickness of 200 nm.

Though the above description refers to a GaAs/GaAlAs heterostructure, it is possible according to the invention to introduce inclusions in the active layer of other known heterostructures. Among the semiconductor alloy heterostructures of III-V compounds, mention can be made of the laser structures (InGa)As/(InAl)As or (InGa)As/InP on highly mismatched Si or GaAs substrate. InAs inclusions can be fabricated here according to the method embodying the invention. A quaternary alloy such as GaInAsP or InGaAlAs can be provided instead of a binary or ternary alloy. The method embodying the invention is also implemented in matched structures when the commercially available substrate used is of insufficient quality, i.e., when it has a high dislocation rate.

The invention also applies to laser structures usually used for optimizing the optical confinement factor and the collection of carriers, such as heterostructures with separate confinement, with confinement separated by index gradient, etc.

It is possible to apply the invention within the framework of other growth techniques for which a transition to a three-dimensional growth mode has been observed. The fabrication of a GaAs laser structure on Si with InAs inclusions is, for instance, also possible in vapor phase epitaxy from organometallic compounds.

Generally speaking, the present invention makes it possible to reduce the degradation of performances of optoelectronic components when this degradation is due to dislocations, whether it is a question of the increase of their number or their propagation, since the influence of dislocations is reduced. This aspect is important for the power application of laser components.

What we claim is:

1. A structure having plural layers in semiconductor material, one of said layers comprising plural substantially parallel sub-layers deposited successively during growth of said one layer, each of said sub-layers having three-dimensional inclusions in a semiconductor material and a narrower forbidden band gap than a forbidden band gap of said one layer.

2. The structure claimed in claim 1, wherein the size of each of said inclusions is in the neighborhood of 50 nm$^3$.

3. The structure claimed in claim 1, wherein said layer comprising said inclusions is an active layer of an optoelectronic component.

4. The structure claimed in claim 1, wherein said inclusions comprise indium arsenide.

5. The structure claimed in claim 1, wherein said layer comprising said inclusions comprises one of the following semiconductor materials: InGaAs, GaAs, GaInAsP, InGaAlAs.

* * * * *